(12) United States Patent
Barth et al.

(10) Patent No.: US 7,553,730 B2
(45) Date of Patent: Jun. 30, 2009

(54) METHODS OF FABRICATION EMPLOYING NANOSCALE MANDRELS

(75) Inventors: Phillip W. Barth, Portola Valley, CA (US); Thomas Edward Kopley, La Honda, CA (US); Nicolas J. Moll, La Honda, CA (US); Ying-Lan Chang, Cupertino, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 172 days.

(21) Appl. No.: 11/487,550

(22) Filed: Jul. 14, 2006

(65) Prior Publication Data

US 2009/0142472 A1    Jun. 4, 2009

(51) Int. Cl.
*H01L 21/336*    (2006.01)

(52) U.S. Cl. ............... 438/270; 438/258; 438/E21.411; 438/E21.412; 257/330

(58) Field of Classification Search ......... 438/270–268, 438/672–673, 637–638, 700, 257–258, E21.441
See application file for complete search history.

(56) References Cited

U.S. PATENT DOCUMENTS

| | | | | |
|---|---|---|---|---|
| 6,806,141 | B2 * | 10/2004 | Kamins | 438/270 |
| 2003/0116531 | A1 * | 6/2003 | Kamins et al. | 216/41 |
| 2008/0113155 | A1 * | 5/2008 | Melechko et al. | 428/131 |

* cited by examiner

*Primary Examiner*—Dung A. Le

(57) ABSTRACT

Synthetic nanopore fabrication methods and structures are provided. Nanoscale transistor fabrication methods and structures are provided.

20 Claims, 2 Drawing Sheets

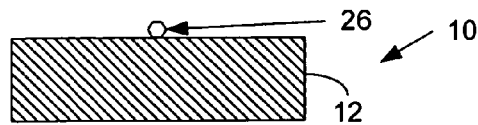
FIG. 1A
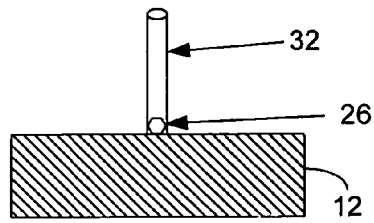
FIG. 1B
FIG. 1C
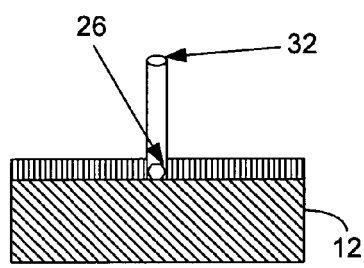
FIG. 1D
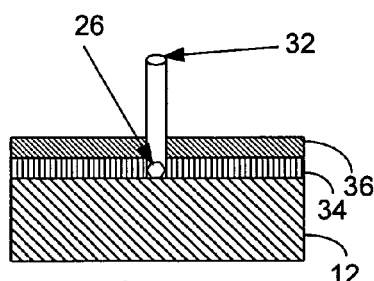
FIG. 1E
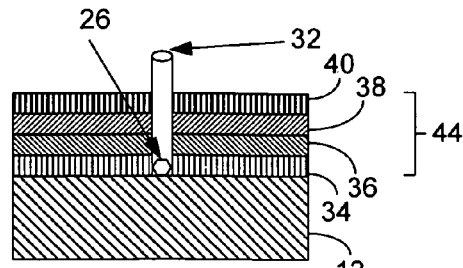
FIG. 1F
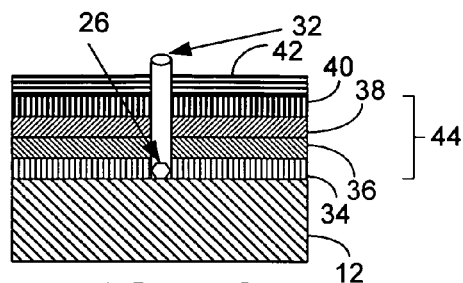
FIG. 1G
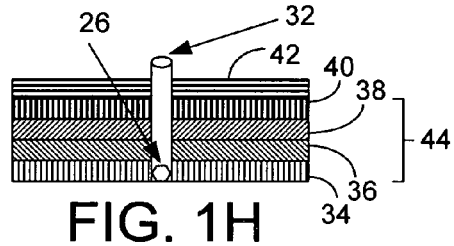
FIG. 1H
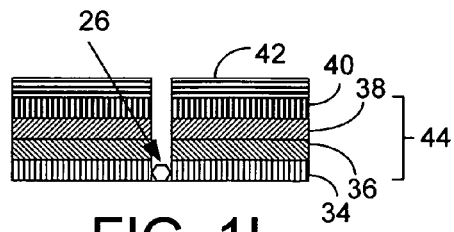
FIG. 1I
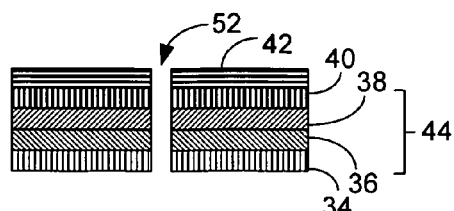
FIG. 1J

METHODS OF FABRICATION EMPLOYING NANOSCALE MANDRELS

BACKGROUND

The "thousand dollar genome" for use in personalized medicine is a much-sought goal in DNA sequencing. Until recently the cost of sequencing the genome of an individual human was estimated to be at least $10 million. Current methods show promise of reducing the cost of sequencing a human genome to $100,000 or perhaps even $20,000. See, for example, "Genome sequencing in microfabricated high-density picolitre reactors," by Marcel Margulies et al., Nature, Jul. 30, 2005, (advance published at nature.com/nature/journal and more specifically on the internet at http://www.nature.com/nature/journal/vaop/ncurrent/pdf/nature03959.pdf), which is incorporated herein in its entirety by reference. However, present methods show no promise of reaching the price point of $1,000, which would make sequencing of an individual's DNA feasible as a routine diagnostic procedure.

The use of synthetically fabricated nanoscale pores, called synthetic nanopores or sometimes simply nanopores, shows promise in performing rapid DNA sequencing. Such pores can in principle be used to position a sensing system, such as electrodes, in close proximity to a DNA strand passing through a nanopore. The nanopore in principle performs a sizing function, restricting molecular passage to one strand of DNA at a time, either single-stranded DNA (ssDNA) or double-stranded DNA (dsDNA). Passage of a molecule through the nanopore is typically performed by use of an applied voltage between two ionic conducting liquid volumes disposed on either side of the nanopore. The applied voltage creates an electric field through the nanopore, and the electric field acts to pull charged long-chain polymer molecules, such as DNA, through the nanopore in a chain-wise fashion, one monomer unit after another. Other molecules, such as RNA or polypeptides, can in principle also be sized by a nanopore and characterized as they pass through the nanopore.

Naturally-occurring biological nanopores (e.g., an alpha-hemolysin ($\alpha$-hemolysin) molecule) have been placed in lipid bilayer membranes and employed to pass single stranded DNA. However, it is difficult to place any sensing system in association with such pores, and early plans to use such pores for DNA sequencing using ionic current measurement, as typified by Baldarelli et al. (U.S. Pat. No. 6,015,714), have proven to be ineffective because fundamental thermal noise considerations in the ionic current going through the nanopore dictate that the current change due to a single nucleotide unit is too small to detect. Still, the $\alpha$-hemolysin molecule does have the advantageous characteristics of atomic precision and reproducibility, that is, each $\alpha$-hemolysin molecule is the same in size, shape, and nanopore diameter. If it were larger diameter and able to be instrumented with a sensing system having better signal-to-noise characteristics, it would be more useful.

More recently, modifications of semiconductor fabrication technology have been used to fabricate synthetic nanopores with larger diameters than a-hemolysin nanopores. Synthetic nanopores fabricated to date have been formed, typically in thin membranes of silicon nitride, by a combination of focused ion beam drilling and argon ion beam sculpting as per Golovchenko, et al., in U.S. Patent Application Publication No. US 2005/0126905, but these processes are slow and inexact, producing nanopores of variable size and shape. Sorting of individual chips containing properly sized pores is possible, but at a cost that is likely too high for purposes of achieving the thousand-dollar genome. Monitoring of ionic current through such pores produces a rough length estimate for a DNA strand passing through the pore, but this sensing modality shows little hope of sequencing the molecule.

Ultra-high-throughput (UHT) DNA sequencing systems using nanopores will require the use of many synthetic nanopores in parallel, placed on one substrate for low cost, each fabricated to a desired size and shape with good uniformity. In addition, each pore must be instrumented with a sensing system having better signal-to-noise characteristics than ionic current sensing systems.

Providing electrodes to instrument the nanopore, and measure a tunneling current through DNA bases transiting the pore, has been described as a method to rapidly sequence DNA by Flory in U.S. Patent Application Publication No. US2004/0144658A1. This method offers higher current levels and better signal-to-noise ratios than the use of ionic currents through the pore, and might be incorporated into systems for UHT DNA sequencing.

One method of fabricating nanopores instrumented with resonant tunneling electrodes has been described and this method uses ion beam sculpting to fabricate the nanopore, much like that described in the aforementioned U.S. Patent Application US 2005/0126905, and as reasoned above, provides pores of variable diameter that may be too expensive for purposes of achieving the thousand-dollar genome.

In a different area of technology, fabrication of nanoscale transistors employing nanotubes or nanowires runs into difficulties. One such difficulty is in placing the source and drain electrical contacts of a nanoscale transistor adjacent, but not touching, the gate contact of the transistor. A second difficulty is in placing a gate contact so that it encircles a nanotube or a nanowire in a fashion providing low electrical capacitance.

The present disclosure addresses some of the limitations described above.

SUMMARY

Methods and systems of fabricating nanopores and nanoscale transistors are described herein.

An embodiment of a method of fabricating a nanopore, among others, includes: providing a structure having a first substrate, the first substrate having a top surface; providing a mandrel adjacent the top surface of the first substrate, the mandrel having an outer wall aspect, a length aspect, and a length; depositing a nanopore substrate atop the first substrate, wherein the nanopore substrate surrounds the outer wall aspect of the mandrel proximal to the first substrate, while leaving the length aspect of the mandrel protruding from the nanopore substrate; and removing the mandrel to leave a nanopore extending through the thickness of the nanopore substrate.

An embodiment of a system for fabricating a nanopore, among others, includes: providing a structure having a first substrate, the first substrate having a top surface; providing a mandrel adjacent the top surface of the first substrate, the mandrel having an outer wall aspect, a length aspect, and a length; means for depositing a nanopore substrate atop the first substrate, wherein the nanopore substrate surrounds the outer wall aspect of the mandrel proximal to the first substrate, while leaving the length aspect of the mandrel protruding from the nanopore substrate; and means for removing the mandrel to leave a nanopore extending through the thickness of the nanopore substrate.

An embodiment of a method for fabricating a nanoscale transistor, among others, includes: providing a structure having a first substrate, the first substrate having a top surface;

providing a mandrel adjacent the top surface of the first substrate, the mandrel having an outer wall aspect, a length aspect, and a length; depositing transistor structural layers atop the first substrate, wherein the transistor structural layers surround the outer wall aspect of the mandrel proximal to the first substrate, while leaving the length aspect of the mandrel protruding from the nanopore substrate; and providing electrical contact to the transistor structural layers.

Other systems, methods, features, and/or advantages will be or may become apparent to one with skill in the art upon examination of the following drawings and detailed description. It is intended that all such additional systems, methods, features, and/or advantages be included within this description and be protected by the accompanying claims.

BRIEF DESCRIPTION OF THE DRAWINGS

Reference is now made to the following drawings. Note that the components in the drawings are not necessarily to scale.

FIGS. 1A through 1J are cross-sectional views that illustrate a representative method of fabricating a synthetic nanopore.

DETAILED DESCRIPTION

Figure 2A:
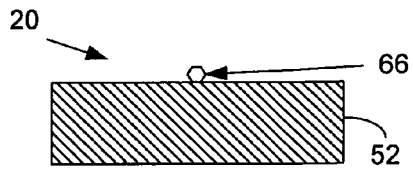
FIGS. 2A through 2I are cross sectional views that illustrate a representative method of fabricating a nanoscale transistor.

As will be described in greater detail here, synthetic nanopore fabrication methods, systems, and structures are provided and nanoscale transistor fabrication methods and structures are provided.

By way of example, some embodiments provide for fabricating a synthetic nanopore by forming or disposing a mandrel nanostructure (e.g., a nanotube, nanorod, nanowire, or nanofiber) onto a first substrate and forming one or more layers (e.g., a nanopore substrate) onto the first substrate around the mandrel. Subsequently, the mandrel is removed to form the nanopore substrate leaving a synthetic nanopore having a well-controlled diameter (e.g., typically about 1 to 10 nanometers (nm)). In short, rather than creating a nanopore in a nanopore substrate, a nanopore substrate is built around the mandrel on a first substrate and then the mandrel is removed to produce the synthetic nanopore in the nanopore substrate. In such case the mandrel may be considered to correspond to other mandrels as used in traditional macroscopic fabrication techniques. Advantageously, if the nanopore is desired to be a through hole rather than a blind hole, an area of the first substrate adjacent the nanopore may be removed, either before or after the mandrel is removed.

As mentioned above, the methods can be used to create high-quality arrays of nanoscale mandrels having a narrow diameter distribution and a well-defined orientation, and multiple nanopores may be placed on a single first substrate if desired. When the mandrels are removed, the present method provides multiple synthetic nanopores having a desired size and shape (as determined by the nanotube, nanorod, nanofiber, or nanowire as described herein). Advantageously, if some or all of the nanopores are desired to be through holes rather than blind holes, areas of the first substrate adjacent one or more of the nanopores may be removed, either before or after the mandrels are removed. It will be appreciated that the first substrate can be supported by a second substrate, and that the nanopore substrate may extend laterally from the first substrate onto the second substrate, so that in some instances the entire first substrate may be removed, leaving the nanopore substrate supported by the second substrate.

The disclosure also includes methods of fabricating nanopore substrates that include a measurement system (i.e., instrumentation) adjacent each synthetic nanopore. The measurement system includes instrumentation components that can include, but are not limited to, electrodes (e.g., resonant tunneling sensing electrodes) and related electrical components for the electrodes as well as other instrumentation components.

In particular, the resonant tunneling electrode can detect and measure tunneling current as the polymer translocates through the synthetic nanopore. The tunneling current can be correlated to a predetermined tunneling current indicative of a specific monomer, for example a purine or pyrimidine nucleotide or base.

The synthetic nanopore fabrication methods of the present disclosure overcome some of the deficiencies and/or disadvantages of other techniques to fabricate synthetic nanopores. For example, the present disclosure enables a plurality of nanopores to be reproducibly created on a single chip simultaneously. It is difficult to reproduce nanopore dimensions using other techniques or combinations of techniques such as electron beam (e-beam), focused ion beam (FIB), ion-beam induced material flow, atomic layer deposition (ALD), molecular layer deposition, molecular vapor deposition, molecular beam epitaxy, and the like, in the absence of the presented use of mandrels having well-controlled diameters.

The nanopore substrates having the synthetic nanopores can be used in nanopore sequencing of polymers (e.g., polynucleotides), where nanopore sequencing has been described previously (U.S. Pat. No. 5,795,782 to Church et al.; U.S. Pat. No. 6,015,714 to Baldarelli et al., the teachings of which are both incorporated herein by reference).

In general, nanopore sequencing involves the use of two separate pools of a medium and an interface between the pools. The interface between the pools is capable of interacting sequentially with the individual monomer residues of a polynucleotide present in one of the pools. Interface dependent measurements are continued over time, as individual monomer residues of the polynucleotide interact sequentially with the interface, yielding data suitable to infer a monomer-dependent characteristic of the polynucleotide. The monomer-dependent characterization achieved by nanopore sequencing may include identifying physical characteristics such as, but not limited to, the number and composition of monomers that make up each individual polynucleotide, in sequential order.

The term "sequencing" as used herein means determining the sequential order of nucleotides in a polynucleotide molecule. Sequencing as used herein includes in the scope of its definition, determining the nucleotide sequence of a polynucleotide in a de novo manner in which the sequence was previously unknown. Sequencing as used herein also includes in the scope of its definition, determining the nucleotide sequence of a polynucleotide wherein the sequence was previously known. Sequencing polynucleotides, the sequences of which were previously known, may be used to identify a polynucleotide, to confirm a polynucleotide, or to search for polymorphisms and genetic mutations. Additional details regarding nanopore analysis systems are described below.

As mentioned above, methods of fabricating one or more synthetic nanopores in a nanopore substrate includes forming the nanopore substrate around a mandrel nanostructure (e.g., a nanotube, nanorod (e.g., a nanowire), or nanofiber). Removing the mandrel creates a synthetic nanopore. The synthetic nanopore has a diameter of about the diameter of the mandrel, which may be about 1 nanometers (nm) to 10 nm.

In short, the method includes providing a structure having a first substrate. A mandrel is then provided atop the top surface of the first substrate. Typically, the mandrel is formed by placing a seed element of the mandrel in a desired location in contact with the top surface of the first substrate, and then growing a body element of the mandrel upwards (transverse with the first substrate as shown in FIGS. 1A through 1J) from the seed element. Alternatively, a pre-existing mandrel may be placed in contact with the top surface of the first substrate, for example by a pick-and-place operation using a scanning tunneling microscope tip or by other technique. Typically the mandrel has a seed element and a body element, but may have a body element without a seed element.

The mandrel has lateral dimensions of nanoscale diameter, typically in the range of about 1 to 10 nm, and advantageously has a body element comprising a nanotube (e.g., carbon nanotube), a nanorod, a nanofiber, or a nanowire.

The mandrel extends from the substrate and desirably has a length aspect that is substantially perpendicular to the substrate (e.g., standing on end as opposed to laying on the substrate or parallel the substrate). The mandrel has a wall aspect disposed along the length aspect.

The seed element and the body element may be formed by any of a number of known techniques. See, for example, "Plasma-induced alignment of carbon nanotubes," by Chris Bower, et al., APPLIED PHYSICS LETTERS, VOLUME 77, NUMBER 6, 7 Aug. 2000, pp 830-832, which describes a technique for growing well-aligned carbon nanotubes using microwave plasma-enhanced chemical vapor deposition. It is shown that nanotubes can be grown on contoured surfaces and aligned in a direction always perpendicular to the local substrate surface.

See also "Delivery of Catalytic Metal Species onto Surfaces with Dendrimer Carriers for the Synthesis of Carbon Nanotubes with Narrow Diameter Distribution," by Hee Cheul Choi, et al., The Journal of Physical Chemistry B, VOLUME 106, NUMBER 48, Dec. 5, 2002, pp 12361-12365, which describes using dendrimers as carriers to deliver complexed Fe(III) ions uniformly onto silicon oxide substrates for the formation of iron oxide nanoparticles with a narrow diameter in the range of 1-2 nm. Chemical vapor deposition (CVD) synthesis with these nanoparticles affords single-walled carbon nanotubes (SWNTs) with a diameter distribution in the range of 1-2 nm. See also "Growth of Single-Walled Carbon Nanotubes from Discrete Catalytic Nanoparticles of Various Sizes," by Yiming Li, et al., Journal of Physical Chemistry B, Vol. 105, No. 46: Nov. 22, 2001, pp 11424-11431, which describes using discrete catalytic nanoparticles with diameters in the range of 1-2 nm and 3-5 nm respectively obtained by placing controllable numbers of metal atoms into the cores of apoferritin, and used for growth of single walled carbon nanotube (SWNTs) on substrates by chemical vapor deposition (CVD).

It will be appreciated that seed elements of diameter larger than about 3-5 nm can be formed by starting with seed elements of about 3-5 nm diameter and subsequently plating using techniques known to those skilled in the art, so that seed elements of 10 nm diameter or larger can be fabricated.

It will further be appreciated that, if multiple seed elements and multiple carbon nanotubes happen to be undesirably fabricated in a given location, that unwanted carbon nanotubes and unwanted seed elements can be machined away using focused ion beam (FIB) machining.

Next, one or more layers of materials are formed atop the first substrate and encircling the wall aspect of the mandrel. The nanopore substrate is formed from the one or more layers. The nanopore substrate may include nanopore analysis detection components (a measurement system that includes instrumentation), for example. The layers can include materials such as, but not limited to, insulators (e.g., aluminum oxide), adhesion materials (e.g., ruthenium), and electrodes (e.g., platinum). Advantageously, such layers may be formed using atomic layer deposition (ALD).

In an embodiment of the methods of forming synthetic nanopores, the layers of material can be conformally and adherently deposited upon the first substrate without being adherently deposited upon the exposed wall aspect of the surface of the mandrel, but at the same time being deposited conformally around the exposed wall aspect of the mandrel without adherently coating the length aspect of the mandrel, so that an uncoated portion of the mandrel remains protruding from the layers of deposited material.

When, for example, the mandrel includes a non-functionalized carbon nanotube, layer deposition using atomic layer deposition (ALD) does not adherently deposit upon the exposed surfaces of the carbon nanotube. Although not intending to be bound by theory, the layer does not deposit on the exposed surfaces of the carbon nanotube because the non-functionalized carbon nanotube surface has strong, fully-occupied carbon-carbon bonds not susceptible to covalent interaction or a strong ionic interaction with material being deposited.

In addition, the layers of material can be adherently deposited upon previously deposited layers of material atop the first substrate without being adherently deposited upon the exposed wall aspects of the surface of the mandrel, again, for example, using ALD.

These processes produce an intermediate structure, in which the uncoated mandrel protrudes from a generally planar aspect of the layer or layers adherently coated upon the first substrate, and provide for fabricating a nanopore having a constant diameter along its own length.

In one embodiment, the nanopore analysis detection components can include one or more, advantageously two, resonant tunneling electrodes and other appropriate electronic components used with resonant tunneling electrodes. The resonant tunneling electrodes are configured to obtain data from polymers interacting with the synthetic nanopore. The term "resonant" or "resonant tunneling" refers to an effect wherein (1) the transmission coefficient of a first quantum tunneling barrier from a first tunneling electrode to a sample under test (SUT), which may include a polymer, is equal to the transmission coefficient of a second quantum tunneling barrier from the SUT to a second tunneling electrode, (2) a first energy level of a conducting electron in the first tunneling electrode is equal to a second electron energy level in the SUT, into which an electron can tunnel from the first tunneling electrode, (3) a third electron energy level is available in the SUT into which an injected electron can travel from the second energy level, and (4) the third electron energy level is equal to a fourth electron conducting energy level in the second tunneling electrode. This arrangement of conditions provides for increased conductivity. Resonant tunneling electrodes measure or detect tunneling current, for example from one electrode through a biopolymer to another electrode.

The resonant tunneling electrodes can be formed in whole or part of one or more of a variety of electrically conductive materials including but not limited to, electrically conductive metals and alloys. Exemplary metals and alloys include, but are not limited to, tin, copper, zinc, iron, magnesium, cobalt, nickel, silver, platinum, palladium, iridium, rhodium, gold, and/or vanadium. Other materials well known in the art that provide for electrical conduction may also be employed. The resonant tunneling electrodes are typically positioned in such a manner that an electrical voltage can be established between them. In operation, a biopolymer to be analyzed is generally positioned sufficiently close to the electrodes, advantageously extending through both of a pair of tunneling electrodes, so that specific monomers and their sequence in the biopolymer can be detected and identified. It will be appreciated that the resonant tunneling electrode can be fitted to the shape and configuration of the nanopore. Advantageously, resonant tunneling electrodes may be formed in pairs around the wall aspect of the mandrel by means of ALD, and insulator layers below, between, and above the paired resonant tunneling electrodes may be formed, also around the wall aspect of the mandrel, by means of ALD.

After the layers are formed, the mandrel is removed to create a synthetic nanopore through the nanopore substrate. One or more synthetic nanopores can be created in a nanopore substrate. Advantageously, a portion of the first substrate adjacent a nanopore may be removed to turn the nanopore from a blind hole into a through hole. In addition, a variety of types of layers can be formed on the nanopore substrate to produce various types of nanopore substrates with one or more different features. After fabricating the nanopore substrate with the synthetic nanopore, the nanopore substrate can be additionally processed to produce an appropriate nanopore substrate.

The following fabrication processes are not intended to be an exhaustive list that includes every step required for fabricating the nanopore substrate. In addition, the fabrication process is flexible because the process steps may be performed in a different order than the order illustrated in FIGS. 1A through 1J.

FIGS. 1A through 1J are cross-sectional views that illustrate a representative method of fabricating a synthetic nanopore. FIG. 1A illustrates a structure 10 having a first substrate 12 and a seed element 26 disposed thereon. The seed element 26 is attached or otherwise interacts (e.g., chemically, biologically, and/or physically) with the first substrate 12. The first substrate 12 can include materials such as, but not limited to, silicon, silicon dioxide, and silicon nitride. The seed element 26 can include seeding particles such as, but not limited to, metal particles (e.g., iron particles), metal oxides, dendrimers, and nanotubes. The seed element 26 has dimensions of about 1 to 10 nm in directions parallel to the surface of first substrate 12.

FIG. 1B illustrates the fabrication of a body element 32 on the seed element 26. The body element 32 desirably has a length aspect substantially perpendicular to the surface of the first substrate 12, so that the body element 32 stands up as shown in FIG. 1B, although the length aspect may lean off of the perpendicular direction at an angle.

The body element 32 can be fabricated using techniques such as, but not limited to, chemical vapor deposition, chemical vapor deposition in an electrostatic field, plasma enhanced chemical vapor deposition (PECVD), and chemical vapor deposition with plasma-induced alignment. The body element 32 can comprise one of, but is not limited to, a single-walled carbon nanotube, a multiple-walled carbon nanotube, a nanowire, a nanofiber, and a nanorod. The diameter of the body element 32 can be about 1 to 10 nm. The length of the body element 32 can be about 10 nm to 10 micrometers.

FIGS. 1C through 1G illustrate the fabrication of a plurality of layers 34, 36, 38, 40, and 42 to form a nanopore substrate 44 around the body element 32. The number of layers can vary and the materials used to make the layers can vary as well. The layers of the nanopore substrate 44 should be constructed with the intent of creating a functioning nanopore substrate 44. The nanopore substrate 44 can include, but is not limited to, detection electrodes (e.g., resonant tunneling electrodes as described above), detection integrated circuitry, and the like. The layers 34, 36, 38, 40, and 42 can be made of materials such as, but not limited to, silicon nitride, silicon oxide, platinum, palladium, iridium, rhodium, ruthenium, aluminum oxide, mica, and polyimide, as well as appropriate materials to produce the detection electrodes and the detection integrated circuitry. The layers 34, 36, 38, 40, and 42 can be formed using techniques including, but not limited to, atomic layer deposition, molecular vapor deposition, molecular layer deposition, and Langmuir-Blodgett film application.

It will be appreciated that for the structure illustrated in FIG. 1G, for some embodiments the nanopore substrate 44 may include a first insulator layer 34, adjacent the first substrate 12, a first electrode layer 36 adjacent the first insulator layer 34, a second insulator layer 38 adjacent the first electrode layer 36, a second electrode layer 40 adjacent the second insulator layer 38, and a third insulator layer 42 adjacent the second electrode layer 40.

FIG. 1H illustrates the removal of the first substrate 12. The first substrate 12 can be removed using techniques such as, but not limited to, lithography, wet chemical etching, plasma etching, and reactive ion etching. It will be appreciated that the first substrate 12 can be in turn supported by a second substrate (not shown) and that the nanopore substrate 44 may extend from the first substrate 12 onto the second substrate, and that after removal of all or a portion of first substrate 12 the nanopore substrate 44 can remain supported by the second substrate, not shown. The second substrate can be a substrate such as, but not limited to, a silicon substrate, a silicon dioxide substrate, a silicon nitride substrate, a metal substrate, a glass substrate, a semiconductor substrate, and combinations thereof.

FIG. 1I illustrates the removal of the body element 32. The body element 32 can be removed using techniques such as, but not limited to, thermal oxidation, plasma oxidation, oxidation in ozone, ozone etching, reactive ion etching, and wet chemical etching.

FIG. 1J illustrates the removal of the seed element 26 to form the synthetic nanopore 52. The seed element 26 can be removed using techniques such as, but not limited to, wet chemical etching, plasma etching, and reactive ion etching. The seed element 26 may be removed either before or after removal of the body element 32. Additional fabrication steps can be performed to further refine the nanopore substrate 44, for example to make proper electronic connections so that measurements can be made using the nanopore substrate 44 and the synthetic nanopore 52. Such additional fabrication steps can occur interspersed with the fabrication steps of FIG. 1A to FIG. 1I, or may occur before the fabrication of the structure shown in FIG. 1A, or may occur after the fabrication of the structure shown in FIG. 1I, or some combination of the above.

It will be appreciated that before, during, and after the steps shown in FIGS. 1C through 1J the lateral extents of layers 34, 36, 38, 40, and 42 can be defined, and contact holes can be formed through layers such as layers 36 and 40 by techniques such as lithography and etching techniques known to those skilled in the arts of semiconductor fabrication. It will further be appreciated that before, during, and after the steps shown in FIGS. 1C through 1J additional conductor layers, not shown, can be connected to layers such as layers 36 and 40 to provide appropriate electrical connections by techniques such as deposition, lithography, and etching techniques known to those skilled in the arts of semiconductor fabrication.

Now having described the methods of making the synthetic nanopore and the nanopore substrate, application of the synthetic nanopore and nanopore substrate is described. The synthetic nanopore and the nanopore substrate formed from any of these methods can be used in a nanopore analysis system to sequence polynucleotides or polypeptides, for example. The nanopore analysis system includes, but is not limited to, the synthetic nanopore and the nanopore substrate and a nanopore detection system. The synthetic nanopore and the nanopore substrate and the nanopore detection system are communicatively coupled so that data regarding a target polynucleotide can be measured.

The nanopore detection system includes, but is not limited to, electronic equipment capable of measuring characteristics of the polynucleotide as it interacts with the synthetic nanopore, a computer system capable of controlling the measurement of the characteristics and storing the corresponding data, control equipment capable of controlling the conditions of the nanopore device, and components that are included in the nanopore substrate that are used to perform the measurements as described below.

The nanopore detection system can measure characteristics such as, but not limited to, the amplitude or duration of individual conductance or electron tunneling current changes across the synthetic nanopore. Such changes can identify the monomers in sequence, as each monomer has a characteristic conductance change signature. For instance, the volume, shape, or charges on each monomer can affect conductance in a characteristic way. Likewise, the size of the entire polynucleotide can be determined by observing the length of time (duration) that monomer-dependent conductance changes occur. Alternatively, the number of nucleotides in a polynucleotide (also a measure of size) can be determined as a function of the number of nucleotide-dependent conductance changes for a given nucleic acid traversing the synthetic nanopore. The number of nucleotides may not correspond exactly to the number of conductance changes, because there may be more than one conductance level change as each nucleotide of the nucleic acid passes sequentially through the synthetic nanopore. However, there is proportional relationship between the two values, which can be determined by preparing a standard with a polynucleotide having a known sequence.

The synthetic nanopore is in fluidic communication with two independent adjacent pools of a medium separated by the nanopore substrate. The two adjacent pools are located on the cis side and the trans side of the nanopore substrate. The synthetic nanopore is dimensioned as to allow sequential monomer-by-monomer translocation (i.e., passage) of only one polynucleotide at a time from one pool to another. Detection components can be used to perform measurements of the target polynucleotide as it translocates.

Exemplary detection components have been described in PCT Patent Application/Publication No. WO 00/79257 and can include, but are not limited to, electrodes directly associated with the nanopore substrate at or near the nanopore, and electrodes placed within the cis and trans pools. The electrodes may be capable of, but limited to, detecting ionic current differences across the two pools or electron tunneling currents across the nanopore.

As the polynucleotide translocates through or passes sufficiently close to the synthetic nanopore, measurements (e.g., ionic flow measurements, including measuring duration or amplitude of ionic flow blockage, quantum resonant tunneling current measurements, or both) can be taken by the nanopore detection system as each of the nucleotide monomers of the polynucleotide passes through or sufficiently close to the synthetic nanopore. The measurements can be used to identify the sequence and length of the polynucleotide.

The medium disposed in the pools on either side of the nanopore substrate can be any fluid that permits adequate polynucleotide mobility for substrate interaction. Typically, the medium is a liquid, usually aqueous solutions or other liquids or solutions in which the polynucleotides can be distributed. When an electrically conductive medium is used, it can be any medium, which is able to carry electrical current. Such solutions generally contain ions as the current-conducting agents (e.g., sodium, potassium, chloride, calcium, cesium, barium, sulfate, or phosphate). Conductance across the synthetic nanopore can be determined by measuring the flow of current across the synthetic nanopore via the conducting medium. A voltage difference can be imposed across the barrier between the pools using appropriate electronic equipment. Alternatively, an electrochemical gradient can be established by a difference in the ionic composition of the two pools of medium, either with different ions in each pool, or different concentrations of at least one of the ions in the solutions or media of the pools. Conductance changes are measured by the nanopore detection system 14 and are indicative of monomer-dependent characteristics.

As mentioned above, the present methods employing nanoscale mandrels may be used for fabricating nanoscale transistors. By way of example, some embodiments provide for fabricating a nanoscale transistor by forming or disposing a mandrel nanostructure (e.g., a nanotube, a nanorod, or a nanofiber) onto a first substrate and forming transistor structural layers onto the first substrate around the mandrel. Electrical contact is made to the transistor structural layers to complete the nanoscale transistor structure.

FIGS. 2A through 2I are cross-sectional views that illustrate a representative method of fabricating a nanoscale transistor. FIG. 2A illustrates a structure 20 having a first substrate 52 and a seed element 66 disposed thereon. The seed element 66 is attached or otherwise interacts (e.g., chemically, biologically, and/or physically) with the first substrate 52. The first substrate 52 can include materials such as, but not limited to, silicon, silicon dioxide, and silicon nitride. The seed element 66 can include seeding particles such as, but not limited to, metal particles (e.g., iron particles), metal oxides, dendrimers, and nanotubes. The seed element 66 has dimensions of about 1 to 10 nm in directions parallel to the surface of first substrate 52.

Figure 2B:
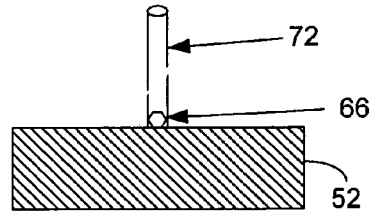
Figure 2C:
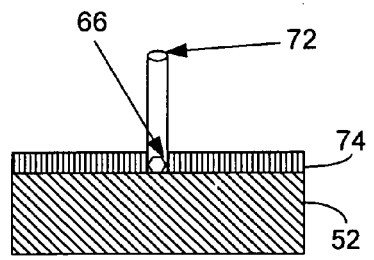
Figure 2D:
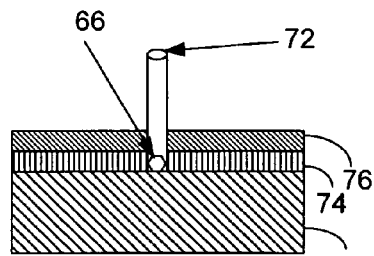
Figure 2E:
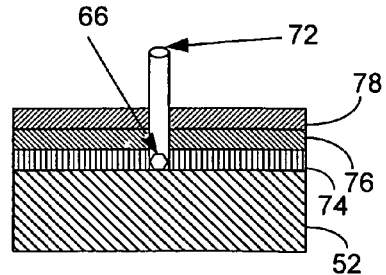
Figure 2F:
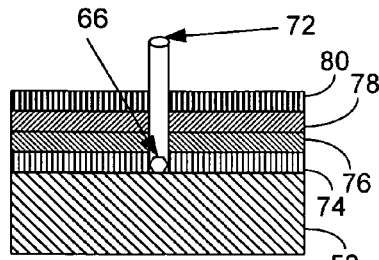
Figure 2G:
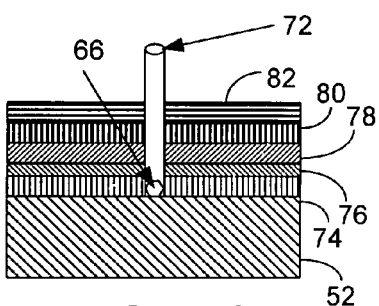
Figure 2H:
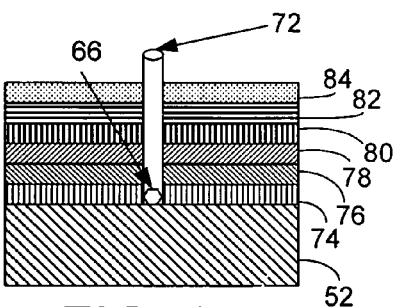
Figure 2I:
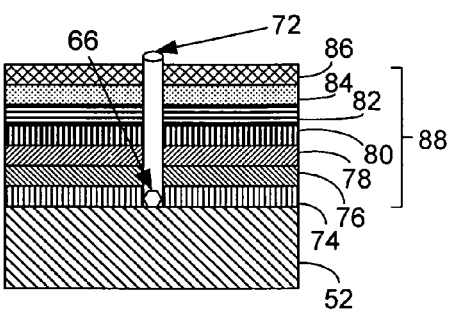

FIG. 2B illustrates the fabrication of a body element 72 on the seed element 66. The body element 72 desirably has a length aspect substantially perpendicular to the surface of the first substrate 52, so that the body element 72 stands up as shown in FIG. 2B, although the length aspect may lean from the perpendicular direction.

The body element 72 can be fabricated using techniques such as, but not limited to, chemical vapor deposition, chemical vapor deposition in an electrostatic field, plasma enhanced chemical vapor deposition (PECVD), and chemical vapor deposition with plasma-induced alignment. The body element 72 can include one of, but is not limited to, a single-walled carbon nanotube, a multiple-walled carbon nanotube, a nanowire, a nanofiber, and a nanorod. The dimensions of body element 72 are similar to the dimensions of body element 32. The diameter of the body element 72 can be about 1 to 10 nm. The length of the body element 72 can be about 10 nm to 10 micrometers.

FIGS. 2C through 2I illustrate the fabrication of a plurality of layers 74, 76, 78, 80, 82, 84, and 86 to form transistor structural layers around the body element 72. The number of layers can vary and the materials used to make the layers can vary as well. The transistor structural layers should be constructed with the intent of creating a functioning transistor 88 that includes the structural layers and the body element 72. The layers 74, 76, 78, 80, 82, 84, and 86 can be made of materials such as, but not limited to, silicon nitride, silicon oxide, platinum, palladium, iridium, rhodium, ruthenium, aluminum oxide, mica, and polyimide, as well as appropriate materials to produce the detection electrodes and the detection integrated circuitry. The layers 74, 76, 78, 80, 82, 84, and 86 can be formed using techniques including, but not limited to, atomic layer deposition, molecular vapor deposition, molecular layer deposition, and Langmuir-Blodgett film application.

Typically, in transistor 88 layer 74 is an insulator, layer 76 is a conductor comprising a source electrode, layer 78 is an insulator, layer 80 is a conductor comprising a gate electrode, layer 82 is an insulator, layer 84 is a conductor comprising a drain electrode, and layer 86 is an insulator.

It will be appreciated that before, during, and after the steps shown in FIGS. 2C through 2I the lateral extents of layers 74, 76, 78, 80, 82, 84, and 86 can be defined, and contact holes can be formed through layers such as layers 74, 78, 82, and 86, by techniques such as lithography and etching techniques known to those skilled in the arts of semiconductor fabrication. It will further be appreciated that before, during, and after the steps shown in FIGS. 2C through 2I additional conductor layers, not shown, can be connected to layers such as layers 76, 80, and 84 to provide electrical connections to transistor 88 by techniques such as deposition, lithography, and etching techniques known to those skilled in the arts of semiconductor fabrication. Additional fabrication steps can be performed to further connect the transistor 88 with other electrical elements on substrate 52 or elsewhere.

It should be emphasized that many variations and modifications may be made to the above-described embodiments. All such modifications and variations are intended to be included herein within the scope of this disclosure and protected by the following claims.

We claim:

1. A method of fabricating a nanopore, comprising:
   providing a structure having a first substrate, the first substrate having a top surface;
   providing a mandrel adjacent to top surface of the first substrate, the mandrel having an outer wall aspect, a length aspect, and a length;
   depositing a nanopore substrate atop the first substrate, wherein the nanopore substrate adherently and conformally coats the first substrate to a nanopore substrate thickness, and wherein the nanopore substrate conformally surrounds the outer wall aspect of the mandrel proximal to the first substrate, while leaving the length aspect of the mandrel protruding from the nanopore substrate; and
   removing the mandrel to leave a nanopore extending through the thickness of the nanopore substrate.

2. The method of claim 1, wherein the length aspect of the mandrel is substantially perpendicular to the top surface of the first substrate.

3. The method of claim 1, wherein the mandrel comprises a seed element and a body element.

4. The method of claim 3, further comprising placing the seed element in contact with the top surface of the first substrate.

5. The method of claim 4, further comprising forming the body element of the mandrel in place adjacent the seed element subsequent to the placement of the seed element on the top surface of the substrate.

6. The method of claim 4, further comprising forming the body element of the mandrel adjacent the seed element prior to the placement of the seed element on the top surface of the substrate.

7. The method of claim 1, wherein the nanopore substrate comprises a plurality of layers.

8. The method of claim 3, wherein the seed element is selected from one of the following: a metal, a metal oxide, a metallic alloy, and an oxide of a metallic alloy.

9. The method of claim 1, further comprising depositing the nanopore substrate using a technique selected from one of the following: an atomic layer deposition technique, a molecular vapor deposition technique, a molecular layer deposition technique, and a Langmuir-Blodgett film formation technique.

10. The method of claim 1, wherein the mandrel is selected from one of the following: a nanotube, a nanowire, a nanofiber, and a nanorod.

11. The method of claim 1, wherein the mandrel is selected from one of the following: a single-walled carbon nanotube and a multiple-walled carbon nanotube.

12. The method of claim 1, further comprising removing the mandrel by a technique selected from: oxidation, ozone etching, wet chemical etching, dry etching, plasma etching, reactive ion etching, ion beam milling, and focused ion beam machining.

13. A method of fabricating a nanopore, comprising:
   providing a structure having a first substrate, the first substrate having a top surface;
   providing a mandrel adjacent to top surface of the first substrate, the mandrel having an outer wall aspect, a length aspect, and a length;
   depositing a nanopore substrate atop the first substrate, wherein the nanopore substrate adherently and conformally coats the first substrate to a nanopore substrate thickness, and wherein the nanopore substrate conformally surrounds the outer wall aspect of the mandrel proximal to the first substrate, while leaving the length aspect of the mandrel protruding from the nanopore substrate; and
   removing the mandrel to leave a nanopore extending through the thickness of the nanopore substrate;
   wherein the nanopore substrate comprises a plurality of layers; and
   wherein the plurality of layers comprises at least one pair of resonant tunneling electrodes.

14. A method of fabricating a nanopore, comprising:
   providing a structure having a first substrate, the first substrate having a top surface;
   providing a mandrel adjacent to top surface of the first substrate, the mandrel having an outer wall aspect, a length aspect, and a length;
   depositing a nanopore substrate atop the first substrate, wherein the nanopore substrate adherently and conformally coats the first substrate to a nanopore substrate thickness, and wherein the nanopore substrate conformally surrounds the outer wall aspect of the mandrel proximal to the first substrate, while leaving the length aspect of the mandrel protruding from the nanopore substrate; and
   removing the mandrel to leave a nanopore extending through the thickness of the nanopore substrate;

wherein the nanopore substrate comprises a first insulator layer adjacent the first substrate, a first electrode layer adjacent the first insulator layer, a second insulator layer adjacent the first electrode layer, a second electrode layer adjacent the second insulator layer, and a third insulator layer adjacent the second electrode layer.

15. A method of fabricating a nanopore, comprising:

providing a structure having a first substrate, the first substrate having a top surface;

providing a mandrel adjacent to top surface of the first substrate, the mandrel having an outer wall aspect, a length aspect, and a length;

depositing a nanopore substrate atop the first substrate, wherein the nanopore substrate adherently and conformally coats the first substrate to a nanopore substrate thickness, and wherein the nanopore substrate conformally surrounds the outer wall aspect of the mandrel proximal to the first substrate, while leaving the length aspect of the mandrel protruding from the nanopore substrate;

removing the mandrel to leave a nanopore extending through the thickness of the nanopore substrate; and removing one of the first substrate and a portion of the first substrate adjacent the nanopore to turn the nanopore from a blind hole to a through hole.

16. The method of claim 15, further comprising removing one of the first substrate and a portion of the first substrate adjacent the nanopore by a technique selected from: a lithography technique, a wet chemical etching technique, a dry etching technique, a plasma etching technique, a reactive ion etching technique, an ion beam milling technique, and a focused ion beam machining technique.

17. A method of fabricating a nanopore, comprising:

providing a structure having a first substrate, the first substrate having a top surface;

providing a mandrel adjacent the top surface of the first substrate, the mandrel having an outer wall aspect, a length aspect, and a length;

depositing a nanopore substrate atop the first substrate, wherein the nanopore substrate surrounds the outer wall aspect of the mandrel proximal to the first substrate, while leaving the length aspect of the mandrel protruding from the nanopore substrate; and removing the mandrel to leave a nanopore extending through the thickness of the nanopore substrate.

18. The method of claim 17, wherein the mandrel comprises a seed element and a body element.

19. The method of claim 18, wherein the body element has a diameter of about 1 to 10 nm.

20. The method of claim 18, wherein the length of the body element is about 10 nm to 10 micrometers.

* * * * *

UNITED STATES PATENT AND TRADEMARK OFFICE
CERTIFICATE OF CORRECTION

PATENT NO. : 7,553,730 B2  Page 1 of 1
APPLICATION NO. : 11/487550
DATED : June 30, 2009
INVENTOR(S) : Phillip W. Barth et al.

It is certified that error appears in the above-identified patent and that said Letters Patent is hereby corrected as shown below:

In column 11, line 47, in Claim 1, delete "adjacent to" and insert -- adjacent the --, therefor.

In column 12, line 35, in Claim 13, delete "adjacent to" and insert -- adjacent the --, therefor.

In column 12, line 55, in Claim 14, delete "adjacent to" and insert -- adjacent the --, therefor.

In column 13, line 10, in Claim 15, delete "adjacent to" and insert -- adjacent the --, therefor.

Signed and Sealed this

First Day of June, 2010

David J. Kappos
*Director of the United States Patent and Trademark Office*